United States Patent
Koelmel et al.

(10) Patent No.: US 7,923,280 B2
(45) Date of Patent: Apr. 12, 2011

(54) MILLISECOND ANNEALING (DSA) EDGE PROTECTION

(75) Inventors: Blake Koelmel, Mountain View, CA (US); Robert C. McIntosh, San Jose, CA (US); David D L Larmagnac, Pontcharra (FR); Alexander N. Lerner, San Jose, CA (US); Abhilash J. Mayur, Salinas, CA (US); Joseph Yudovsky, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/834,620

(22) Filed: Jul. 12, 2010

(65) Prior Publication Data

US 2010/0273334 A1   Oct. 28, 2010

Related U.S. Application Data

(63) Continuation of application No. 12/032,475, filed on Feb. 15, 2008, now Pat. No. 7,754,518.

(51) Int. Cl.
*H01L 21/00* (2006.01)

(52) U.S. Cl. .......... 438/57; 438/58; 257/E31.001; 257/E23.114

(58) Field of Classification Search .......... 438/10, 438/57, 58, 71, 96, 97; 257/E31.001, E23.114
See application file for complete search history.

(56) References Cited

U.S. PATENT DOCUMENTS

| | | | |
|---|---|---|---|
| 5,079,112 A | 1/1992 | Berger et al. | |
| 5,146,092 A | 9/1992 | Apperson et al. | |
| 5,912,468 A | 6/1999 | Hirano et al. | |
| 6,835,914 B2 | 12/2004 | Timans | |
| 6,933,240 B2 | 8/2005 | Lazar et al. | |
| 7,277,213 B2 | 10/2007 | Watson et al. | |
| 7,368,303 B2 | 5/2008 | You et al. | |
| 2004/0045667 A1 | 3/2004 | Yogev et al. | |
| 2006/0084188 A1 | 4/2006 | You et al. | |
| 2006/0119919 A1 | 6/2006 | Watson et al. | |
| 2006/0286807 A1 | 12/2006 | Hwang et al. | |
| 2007/0212859 A1 | 9/2007 | Carey et al. | |
| 2007/0218644 A1 | 9/2007 | Balakrishna et al. | |
| 2007/0221640 A1 | 9/2007 | Jennings et al. | |

FOREIGN PATENT DOCUMENTS

KR   10-2001-0062301   7/2001

OTHER PUBLICATIONS

International Search Report and Written Opinion of the International Searching Authority mailed Jun. 25, 2009 in PCT/US2009/033102.

*Primary Examiner* — Michelle Estrada
(74) *Attorney, Agent, or Firm* — Patterson & Sheridan, LLP

(57) ABSTRACT

A method and apparatus for thermally processing a substrate is provided. A substrate is disposed within a processing chamber configured for thermal processing by directing electromagnetic energy toward a surface of the substrate. An energy blocker is provided to block at least a portion of the energy directed toward the substrate. The blocker prevents damage to the substrate from thermal stresses as the incident energy approaches an edge of the substrate.

9 Claims, 10 Drawing Sheets

MILLISECOND ANNEALING (DSA) EDGE PROTECTION

CROSS-REFERENCE TO RELATED APPLICATIONS

This application is a continuation of U.S. patent application Ser. No. 12/032,475, filed Feb. 15, 2008 now U.S. Pat. No. 7,754,518, which is herein incorporated by reference.

BACKGROUND OF THE INVENTION

1. Field of the Invention

Embodiments of the present invention generally relate to an apparatus and method for manufacturing a semiconductor device. More particularly, the invention is directed to an apparatus and method for thermally processing a substrate.

2. Description of the Related Art

The integrated circuit (IC) market is continually demanding greater memory capacity, faster switching speeds, and smaller feature sizes. One of the major steps the industry has taken to address these demands is to change from batch processing silicon substrates in large furnaces to single substrate processing in a small chamber.

During single substrate processing, the substrate is typically heated to a high temperature to allow various chemical and physical reactions to take place in multiple IC devices defined in portions of the substrate. Of particular interest, favorable electrical performance of the IC devices requires implanted regions to be annealed. Annealing recreates a crystalline structure from regions of the substrate that were previously made amorphous, and activates dopants by incorporating their atoms into the crystalline lattice of the substrate. Thermal processes such as annealing require providing a relatively large amount of thermal energy to the substrate in a short amount of time, and then rapidly cooling the substrate to terminate the thermal process. Examples of thermal processes currently in use include Rapid Thermal Processing (RTP) and impulse (spike) annealing. Conventional RTP processes heat the entire substrate even though the IC devices reside only in the top few microns of the silicon substrate. This limits how fast one can heat and cool the substrate. Moreover, once the entire substrate is at an elevated temperature, heat can only dissipate into the surrounding space or structures. As a result, today's state of the art RTP systems struggle to achieve a 400° C./s ramp-up rate and a 150° C./s ramp-down rate. While RTP and spike annealing processes are widely used, current technology is not ideal because it ramps substrate temperature too slowly during thermal processing, exposing the substrate to elevated temperatures for an extended period of time. These thermal budget problems become more severe with increasing substrate sizes, increasing switching speeds, and/or decreasing feature sizes.

To resolve some of the problems raised in conventional RTP processes, various scanning laser anneal techniques have been used to anneal surfaces of substrates. In general, these techniques deliver a constant energy flux to a small region on the surface of a substrate while the substrate is translated, or scanned, relative to the energy delivered to the small region. Due to stringent uniformity requirements and the complexity of minimizing the overlap of scanned regions across the substrate surface, these types of processes are not effective for thermal processing contact level devices formed on the surface of the substrate.

Dynamic surface annealing (DSA) techniques have been developed to anneal finite regions on the surface of the substrate to provide well-defined annealed and/or re-melted regions on the surface of the substrate. Generally, during such laser anneal processes, various regions on the surface of the substrate are sequentially exposed to a desired amount of energy delivered from the laser to cause the preferential heating of desired regions of the substrate. These techniques are preferred over conventional processes that sweep the laser energy across the surface of the substrate because the overlap between adjacent scanned regions is strictly limited to the unused space between die, or "kurf," lines, resulting in more uniform annealing across the desired regions of the substrate.

One disadvantage to DSA techniques is that annealing a portion of the surface of the substrate subjects the interface region between annealed portions and non-annealed portions to high thermal stresses during annealing due to temperature differences of up to 500° C. In most cases, these thermal stresses are relieved as heat conducts from the annealed region into the non-annealed region of the substrate. However, as the annealing process moves toward an edge of the substrate, the availability of heat-absorbing substrate domains is reduced by proximity to the edge, and thermal stresses cause physical deformation or breakage of the substrate. FIG. 1 illustrates an annealing process attempting to anneal a portion 102 of substrate 100 near its edge 104. The electromagnetic energy 106 radiating from source 108 heats portion 102, while edge portion 110 remains unheated. The interface area between annealed portion 102 and edge portion 110 develops high thermal stress due to the relatively small heat-absorbing capacity of edge portion 110. This high thermal stress is frequently relieved by deformation or breakage in edge portion 110 near edge 104 of substrate 100. Thus, there is a need for a thermal processing apparatus and method capable of annealing all desired regions of the substrate without damaging the substrate.

SUMMARY OF THE INVENTION

Embodiments of the present invention provide an apparatus for processing a substrate in a processing chamber, comprising a substrate support configured to position a substrate for processing, an energy source configured to direct electromagnetic energy toward the substrate support, and one or more energy blockers configured to block at least a portion of the electromagnetic energy.

Other embodiments of the present invention provide a method of processing a substrate in a processing chamber, comprising using a substrate support to position the substrate in the processing chamber, directing electromagnetic energy toward at least a portion of the substrate, and blocking at least a portion of the electromagnetic energy from striking the substrate.

BRIEF DESCRIPTION OF THE DRAWINGS

So that the manner in which the above recited features of the present invention can be understood in detail, a more particular description of the invention briefly summarized above may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide an apparatus and method for thermal processing of a substrate. In a process chamber configured to perform thermal processes involving directing electromagnetic energy toward at least a portion of the surface of a substrate, a device is deployed to block at least a portion of the electromagnetic energy from reaching the substrate. The device is configured to allow insertion and removal of the substrate by any of several means, and is made to withstand the conditions present during processing of the substrate.

Figure 1:
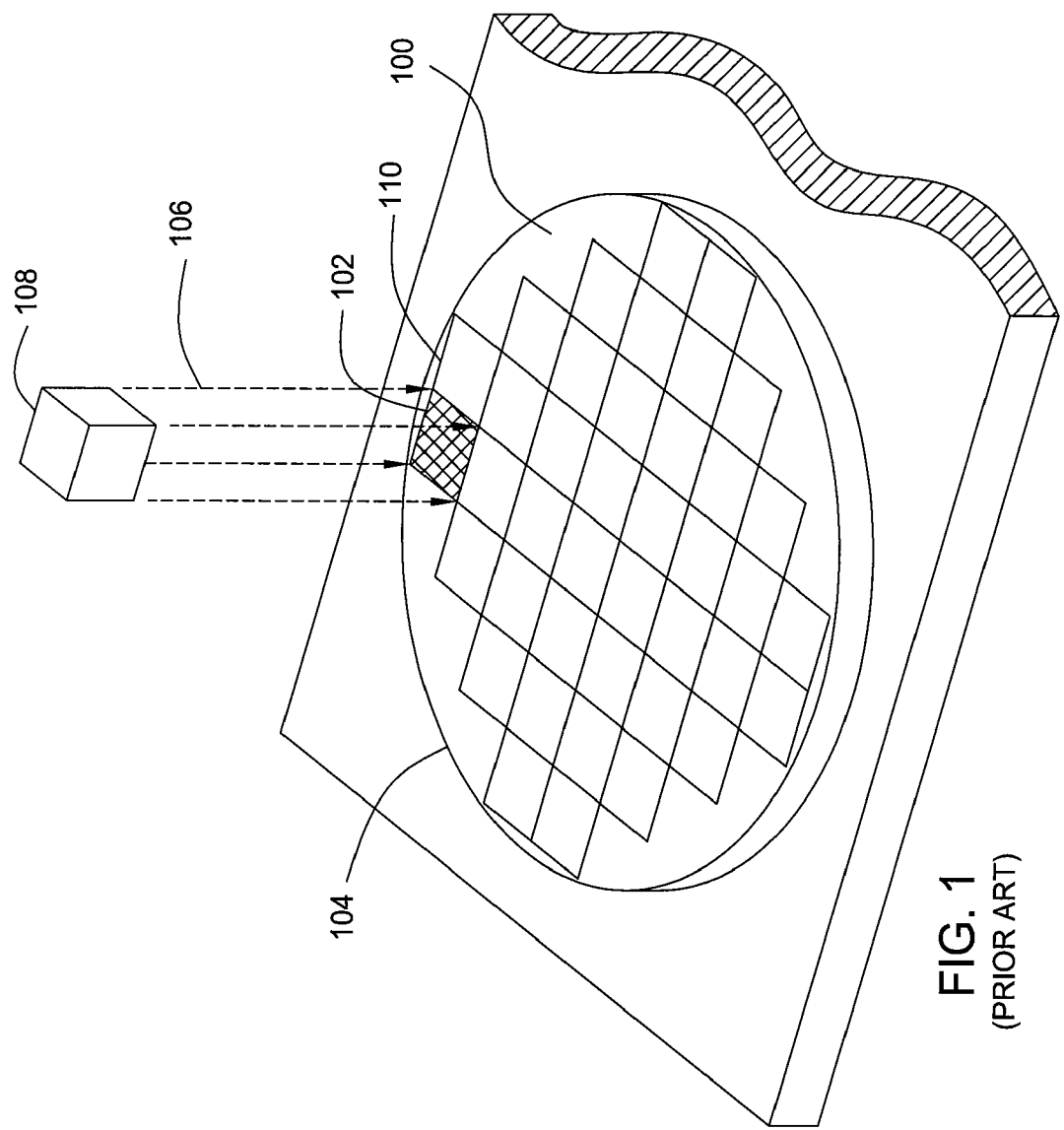
FIG. 1 is a prior art representation of a thermal processing apparatus performing thermal treatment of a substrate.
Figure 2:
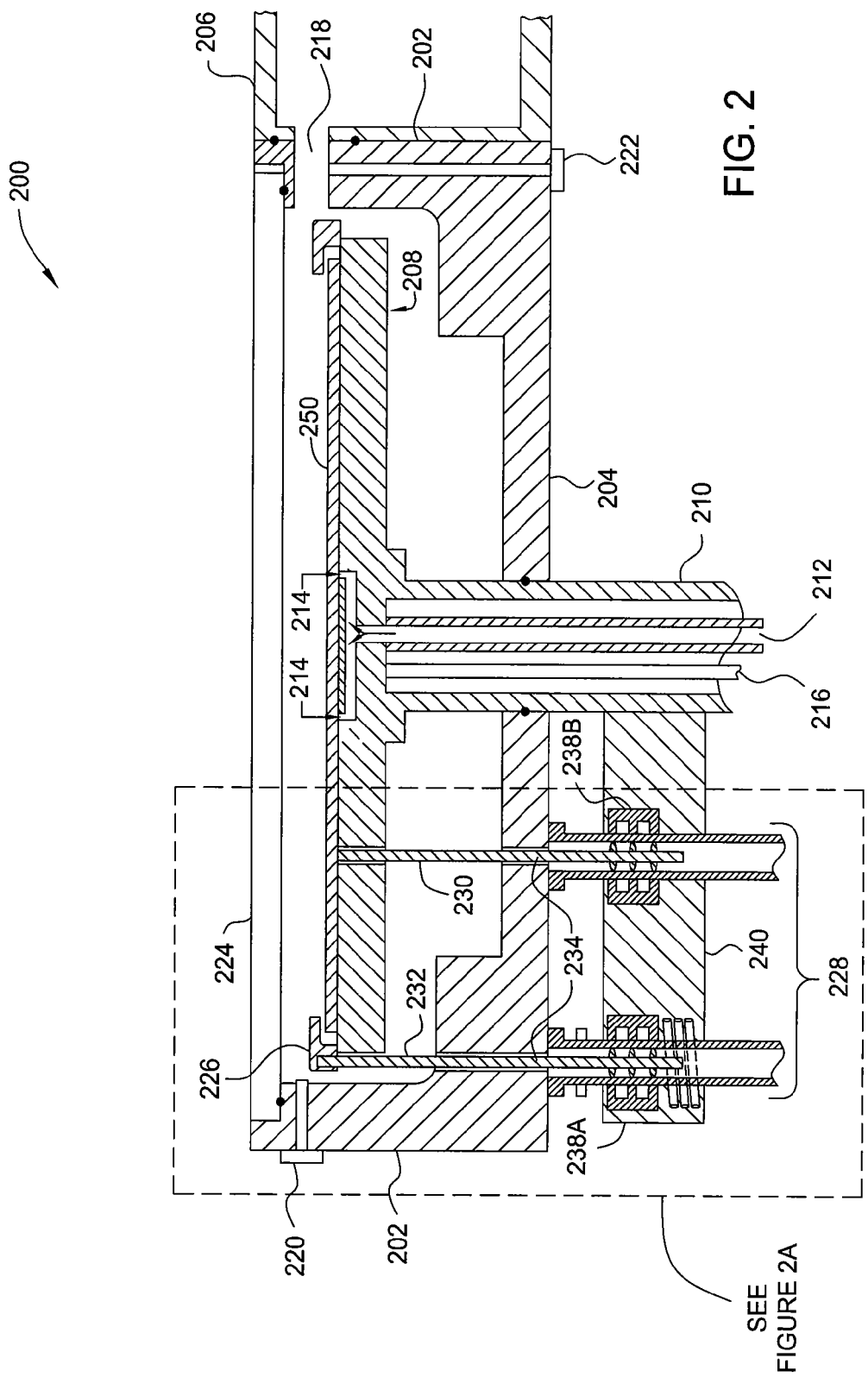
FIG. 2 is a cross-section view of an apparatus according to one embodiment of the invention.

FIG. 2 is a cross-section view of a thermal processing chamber 200 according to one embodiment of the invention. Chamber 200 features a wall 202, a floor 204, and a top portion 206 cooperatively defining a processing chamber. The processing chamber contains a substrate support 208 for positioning a substrate in the chamber. The substrate support 208 includes a conduit portion 210, which pierces floor 204, for carrying various processing media to and from the substrate support. Conduit portion 210 may include passage 212 for carrying processing media to a surface of substrate support 208 through openings 214. Conduit portion 210 may also include passage 216 for carrying thermal control media to channels inside substrate support 208, enabling substrate support 208 to be heated or cooled. For illustration purposes, a substrate 250 is shown disposed on substrate support 208.

A substrate may be introduced to chamber 200 through portal 218, which may be sealed by a door (not shown) if desired. Process gases may be introduced to the process chamber through portal 220, and may be evacuated through portal 222, or through any other suitable conduit. In some embodiments, it may be advantageous, for example, to evacuate process gases through a conduit in substrate support 208. In other embodiments, gases may be provided to the back side of a substrate disposed on substrate support 208 through a conduit therein (not shown). Such gases may be useful for thermal control of the substrate during processing in high vacuum. Thermal control gases are generally different from process gases.

Chamber 200 is generally juxtaposed with a source (not shown) for directing electromagnetic energy toward a substrate disposed in chamber 200. Electromagnetic energy is admitted to the processing chamber through window 224 in top portion 206, which may be quartz or another suitable material, for transmitting electromagnetic energy while withstanding processing conditions. Chamber 200 also includes an energy blocker 226 configured to block at least a portion of the electromagnetic energy coming from the source toward substrate support 208.

Chamber 200 also includes a lift pin assembly 228 for manipulating the energy blocker and the substrate inside the apparatus. In one embodiment, lift pin assembly 228 comprises a plurality of lift pins 230 for manipulating substrate 250 and a plurality of lift pins 232 for manipulating energy blocker 226. Lift pins may enter chamber 200 through a plurality of passages 234.

Figure 2A:
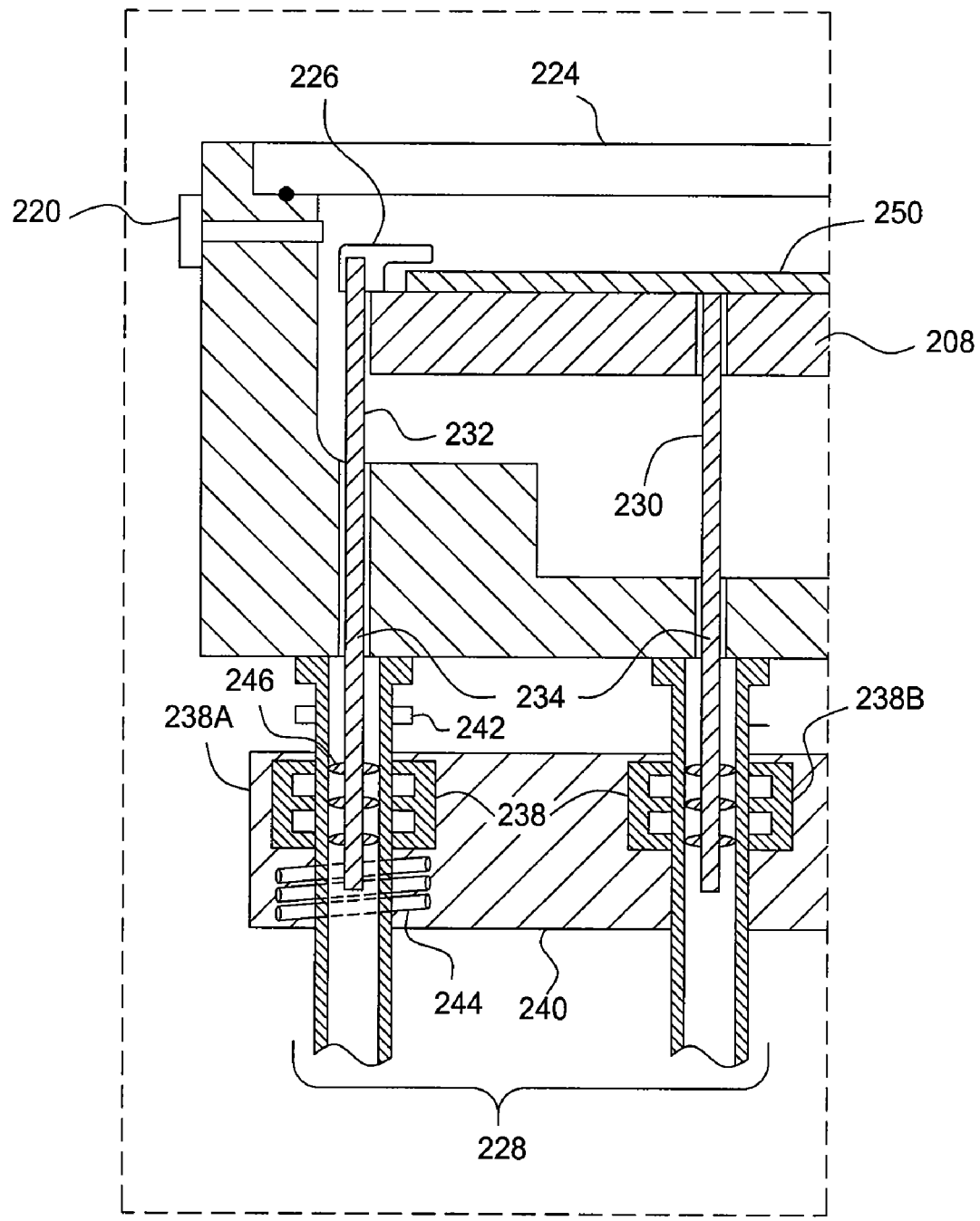
FIG. 2A is a detail view of a portion of the apparatus of FIG. 2.

FIG. 2A is a detail view of portions of chamber 200. Window 224, energy blocker 226, and portal 220 are visible, as is lift pin assembly 228 in greater detail. Lift pins 230 and 232 are guided by guide tubes 236, which ensure proper alignment of lift pins 230 and 232. In one embodiment, lift pins 230 and 232 are enclosed by shuttles 246, which contact the inside of guide tubes 236 to maintain alignment of lift pins 230 and 232 with guide tubes 236. Shuttles 246 may be any rigid material, but will preferably have a low-friction surface for impinging on guide tube surfaces. In one embodiment, shuttles 246 may be ferritic stainless steel with plastic bushings (not shown) for contacting guide tubes 236. In some embodiments, lift pins 230 and 232 may be manipulated by actuator collars 238, which are magnetically coupled to lift pins 230 and 232 by shuttles 246, as shown in FIG. 2A. Actuator collars 238 are configured to travel in a longitudinal direction relative to guide tubes 236, extending and retracting lift pins 230 and 232 as needed. An actuator arm moves actuator collars 238 along guide tubes 236 to extend and retract lift pins. In this embodiment, a single actuator arm 240 operates both sets of lift pins 230 and 232, but multiple actuators arms may be used if desired. Extension of lift pin 232 into chamber 200 is limited by stop 242. A guide tube spring 244 may be provided as shown in FIG. 2A to allow actuator arm 240 to continue moving toward chamber 200 after lift pin 230 has been curtailed by stop 242. In this way, lift pin 230 may continue moving after lift pin 232 has stopped, with a single actuator arm 240 moving both. In this embodiment, lift pin 232 is longer than lift pin 230 to allow lift pin 232 to lift energy blocker 226 before lift pin 230 lifts substrate 250 off of substrate support 208.

Energy blocker 226 is configured to block a portion of the electromagnetic energy directed toward substrate 250 through window 224. As will be seen in greater detail below, energy blocker 226 may be configured such that a portion rests on substrate support 208 while another portion extends above a portion of substrate support 208. In some embodiments, energy blocker 226 casts a shadow over the edge of a substrate disposed on substrate support 208. Energy blocker 226 may thus be referred to as a shadow ring or an edge ring. Lift pins may manipulate energy blocker 226 by mating with recesses.

In operation, lift pin 232 extends into the process chamber, lifting energy blocker 226 above substrate support 208 a sufficient distance to allow manipulation of substrate 250 disposed on substrate support 208 without contacting energy blocker 226. Lift pin 230 extends into the process chamber to lift substrate 250 above substrate support 208, allowing a substrate handling mechanism (not shown) to enter the process chamber through portal 218 (FIG. 2) and access the substrate. As actuator 240 moves both lift pins upward, actuator collar 238A impinges stop 242. Actuator arm 240 continues moving, compressing guide tube spring 244 against actuator collar 238A, while actuator collar 238B continues moving lift pin 230 upward. With a substrate handling mechanism extended into the process chamber, actuator arm 240 retracts lift pin 230 until guide tube spring 244 is fully extended, and then retracts both lift pins 230 and 232 until substrate 250 and energy blocker 226 rests on substrate support 208. In this embodiment, with a single actuator 240, lift pins 230 and 232 extend and retract together. In embodiments with multiple actuators, lift pin 232 may remain extended when no substrate is disposed on substrate support 208. When a substrate is provided to the processing chamber by a handling mechanism, lift pin 230 may then extend to lift the substrate above the handling mechanism, allowing the handling mechanism to retract from the processing chamber through portal 218 (FIG. 2). Lift pin 230 may then retract to dispose the substrate on substrate support 208. Lift pin 232 may then retract to dispose energy blocker 226 in a processing position.

To remove a substrate from the chamber, lift pins 230 and 232 operate in reverse. In a single-actuator embodiment, both lift pins extend into the process chamber. Lift pin 232 engages energy blocker 226 first, elevating it above substrate support 208. Lift pin 230 engages substrate 250 a short time later, and both ascend above substrate support 208 by operation of the lift pins 230 and 232. When actuator collar 238A reaches stop 242, lift pin 232 stops ascending, and guide tube spring 244 compresses as actuator arm 240 continues moving upward. As actuator arm 240 continues moving upward, lift pin 230 continues to move, while lift pin 232 remains stationary. Thus, substrate 250, supported by lift pins 232, approaches energy blocker 226. When collar 238B reaches the upper extremity of guide tube 236, actuator arm 240 and lift pin 230 stop moving. A substrate handling apparatus may then extend into the process chamber. The actuator arm may then descend, lowering substrate 250 onto the substrate handling apparatus for withdrawal from the chamber. In multiple-actuator embodiments, lift pin 232 may remain fully extended while substrate 250 is manipulated from substrate support 208 to substrate handling apparatus, and while a new substrate is manipulated onto substrate support 208, if desired.

Figure 3:
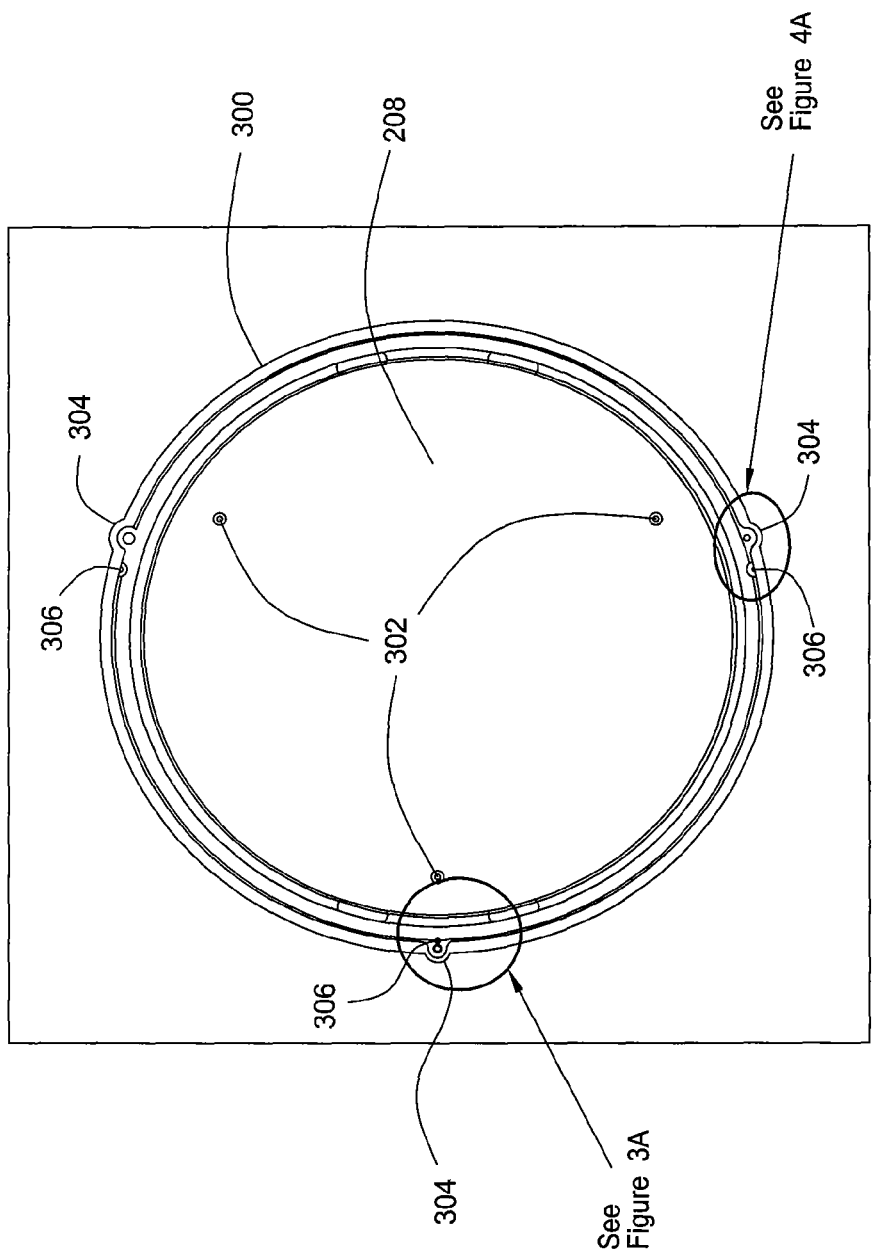
FIG. 3 is a top view of an apparatus according to one embodiment of the invention.

FIG. 3 is a top view of an apparatus according to one embodiment of the invention. FIG. 3 illustrates one embodiment of an energy blocker 300 as described above. In some embodiments, the energy blocker 300 is a radiation blocker. In this embodiment, energy blocker 300 is a ring, annular in shape and formed as a single article, configured to block some energy being directed toward substrate support 208. In some embodiments, energy blocker 300 may be opaque, while in other embodiments energy blocker 300 may be partially transparent to some frequencies of electromagnetic energy used to anneal the substrate while blocking other frequencies. In this embodiment, substrate support 208 features openings 302 to allow lift pins 230 (FIGS. 2 and 2A) to deploy from beneath substrate support 208 to manipulate a substrate disposed thereon. In this embodiment, energy blocker 300 features tabs 304 for mating with lift pins 232 (FIGS. 2 and 2A). The lift pins move energy blocker 300 to allow for translation of a substrate inside the process chamber. Energy blocker 300 also features alignment points 306 for aligning energy blocker 300 with substrate support 208.

Figure 3A:
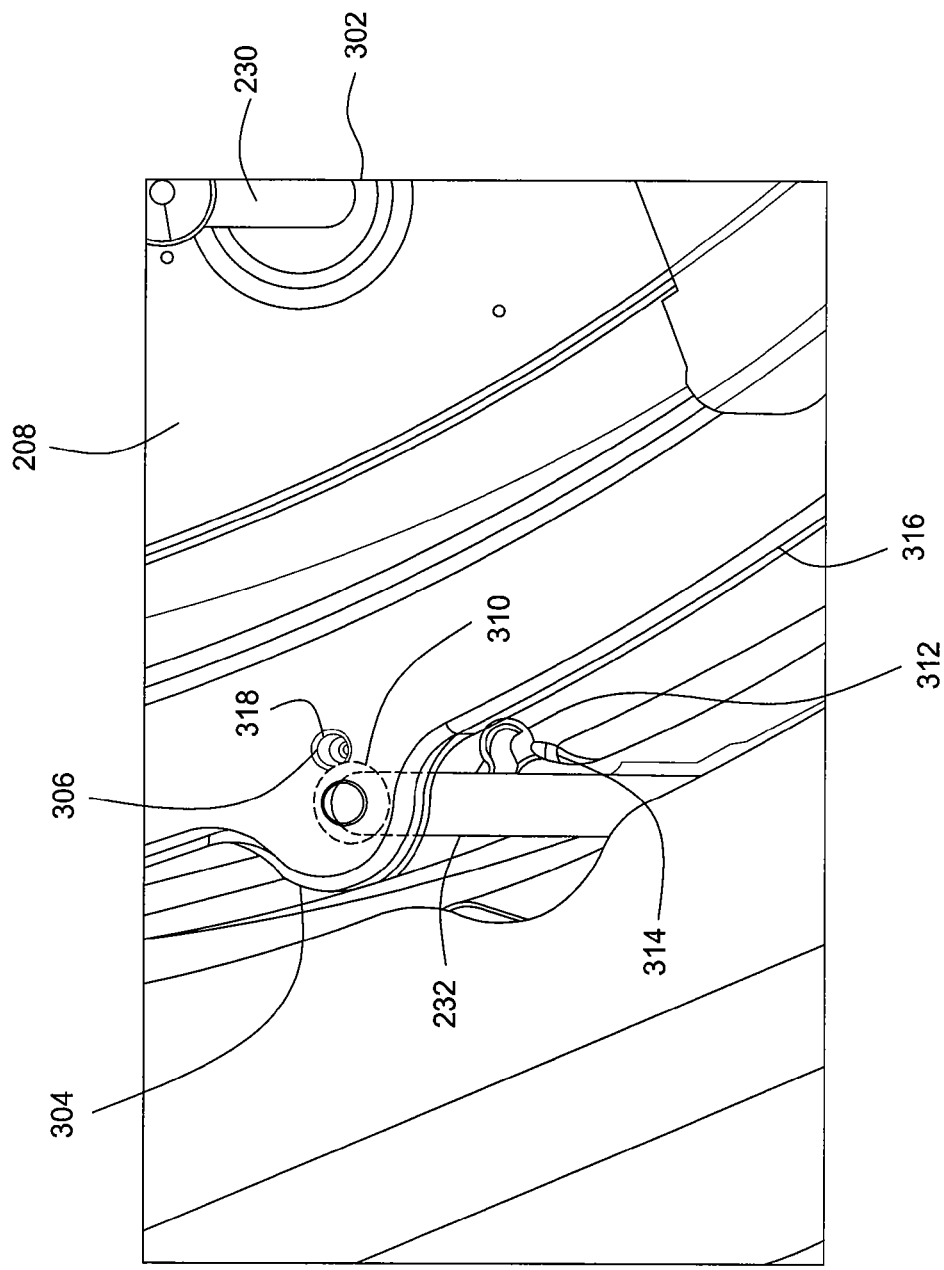
FIG. 3A is a detail view of a portion of the apparatus of FIG. 3.

FIG. 3A is a detail view of a portion of the apparatus of FIG. 3. A section of the energy blocker 300 is shown, in which the lift pin tab 304 and alignment point 306 are visible. Also visible is the substrate support 208 and opening 302 therein, with lift pin 230 shown in its extended position. Lift pin 232 is also shown in its extended position, mating with tab 304. In this embodiment, lift pin 232 mates with tab 304 by virtue of recess 310. In this embodiment, the lift pins and recesses have a circular cross-sectional shape, but in other embodiments they may have any shape, such as square, rectangular, triangular, oval, and the like. Additionally, although the embodiment of FIG. 3 features three tabs for three lift pins, any convenient number of lift pins may be used, so long as an energy blocker can be adequately manipulated. In this embodiment, alignment point 306 is a tapered pin projecting downward from energy blocker 300 and mating with notch 312. From the top of energy blocker 300, alignment point 306 appears as a recess in the upper surface of energy blocker 300. Any arrangement and number of alignment points 306 designed to ensure alignment of energy blocker 300 with substrate support 208 may be used. For example, alignment pins may be disposed on substrate support 208 pointing upward into recesses formed in energy blocker 300. Alignment of energy blocker 300 with substrate support 208 ensures that the desired portions of a substrate disposed on substrate support 208 are shielded from electromagnetic radiation.

Figure 3B:
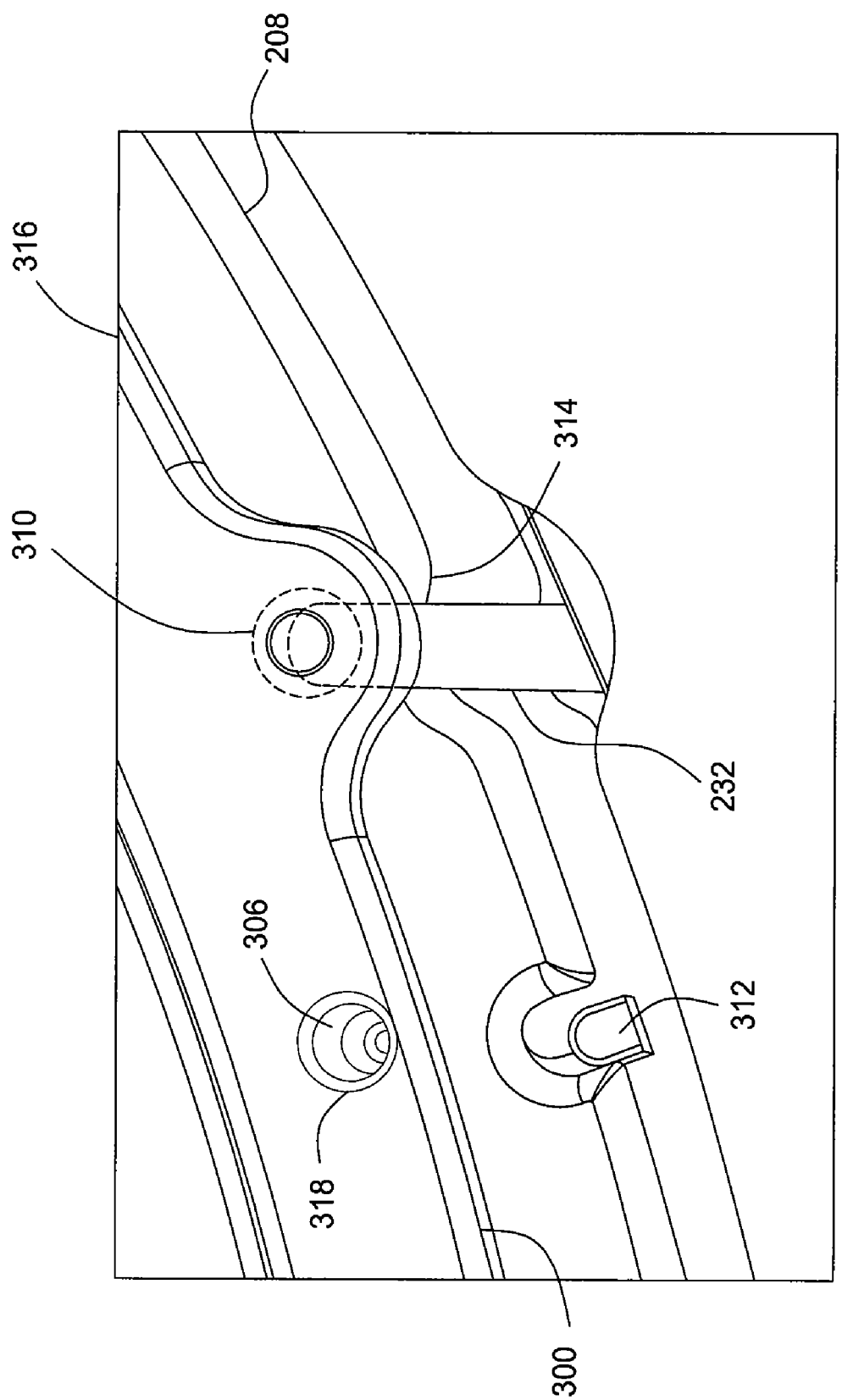
FIG. 3B is a detail view of another portion of the apparatus of FIG. 3.

In the embodiment illustrated by FIG. 3A, notch 312 is aligned with indentation 314 to allow lift pin 232 to travel freely past substrate support 208 and engage with recess 310 in tab 304. FIG. 3B shows an alternate embodiment in which alignment point 306 is displaced from indentation 314. In both embodiments illustrated by FIGS. 3A and 3B, energy blocker 300 has a rounded or beveled edge 316. Alignment point 306 also has a rounded or beveled edge 318 on the upper surface of energy blocker 300. In these two embodiments, edge 318 of alignment point 306 is shown substantially tangent to the inner extremity of rounded or beveled edge 316 of energy blocker 300. Alternate embodiments may, however, include alignment features located at any convenient point. For the two illustrated embodiments, alignment points 306 may be located a distance approximately halfway between the inner and outer edge of energy blocker 300, or substantially tangent to the inner edge.

Figure 4A:
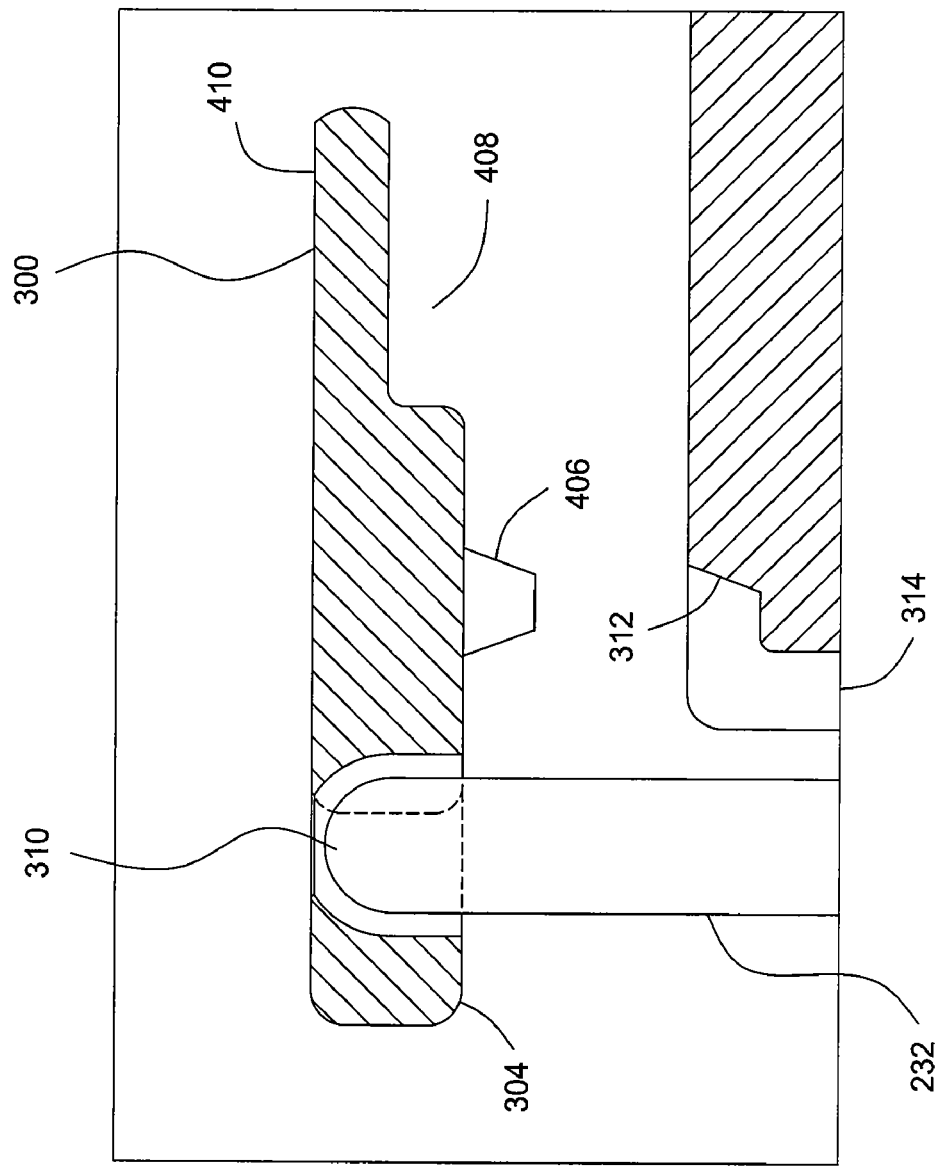
FIG. 4A is a cross-section view of an apparatus according to one embodiment of the invention.
Figure 4B:
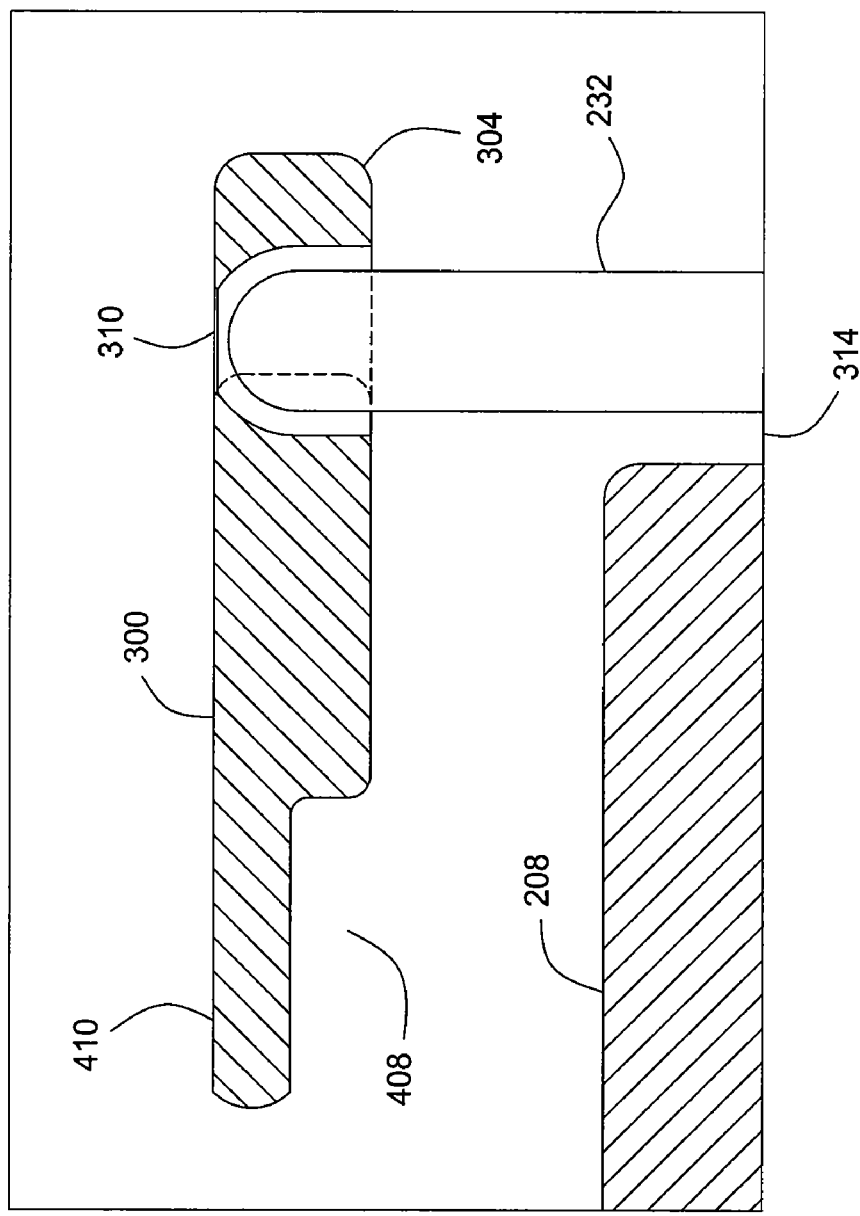
FIG. 4B is another cross-section view of an apparatus according to one embodiment of the invention.

FIG. 4A is a cross-section view of an apparatus according to one embodiment of the invention. In this embodiment, energy blocker 300 is shown in a spaced-apart configuration relative to substrate support 208. Lift pin 232 is visible mating with recess 310 in tab 304, as described above. Alignment point 306 is illustrated in this embodiment as a frustroconical pin 406 projecting downward from energy blocker 300 for mating with notch 312, with no corresponding recess in the upper surface of energy blocker 300. In operation, the energy blocker of this embodiment is configured to rest on substrate 208 during processing. Energy blocker 300 features cutaway portion 408 designed to remain spaced apart from substrate support 208 when energy blocker 300 rests on substrate support 208. Cutaway portion 408 is sized such that extension 410 extends over a portion of a substrate disposed on substrate support 208 during processing. Extension 410 thus creates a shadow over a portion of a substrate resting on substrate support 208, preventing electromagnetic energy from impinging the substrate too close to its edge. In this way, energy blocker 300 with extension 410 protects the edge of a substrate disposed on substrate support 208 from deformation or damage due to extreme thermal stresses during processing. Energy blocker 300 is thus sometimes referred to as a shadow ring or an edge ring. FIG. 4B illustrates an alternate embodiment, as in FIG. 3B, wherein notch 312 is not aligned with indentation 314.

In the embodiment of FIG. 4A, energy blocker 300 may be up to about 5 millimeters (mm) thick at its thickest point. Cutaway portion 408 may reduce thickness by up to about 80%, resulting in thickness of extension 410 less than about 3 mm. Extension 410 may create a shadow on the substrate up to about 3 mm from an edge of the substrate. Clearance between extension portion 410 and a substrate resting on substrate support 208 may be less than about 2 mm during processing. Energy blocker 300 may be made of any material capable of withstanding processing conditions, but is preferably made of alumina (aluminum oxide, $Al_xO_y$, where the ratio of y/x is from about 1.3 to about 1.7), aluminum nitride (AlN), quartz (silicon dioxide, $SiO_2$), or silicon carbide (SiC), most preferably from alumina. These materials may be used to make an energy blocker that is opaque or that transmits some or all electromagnetic energy incident thereon.

Figure 5:
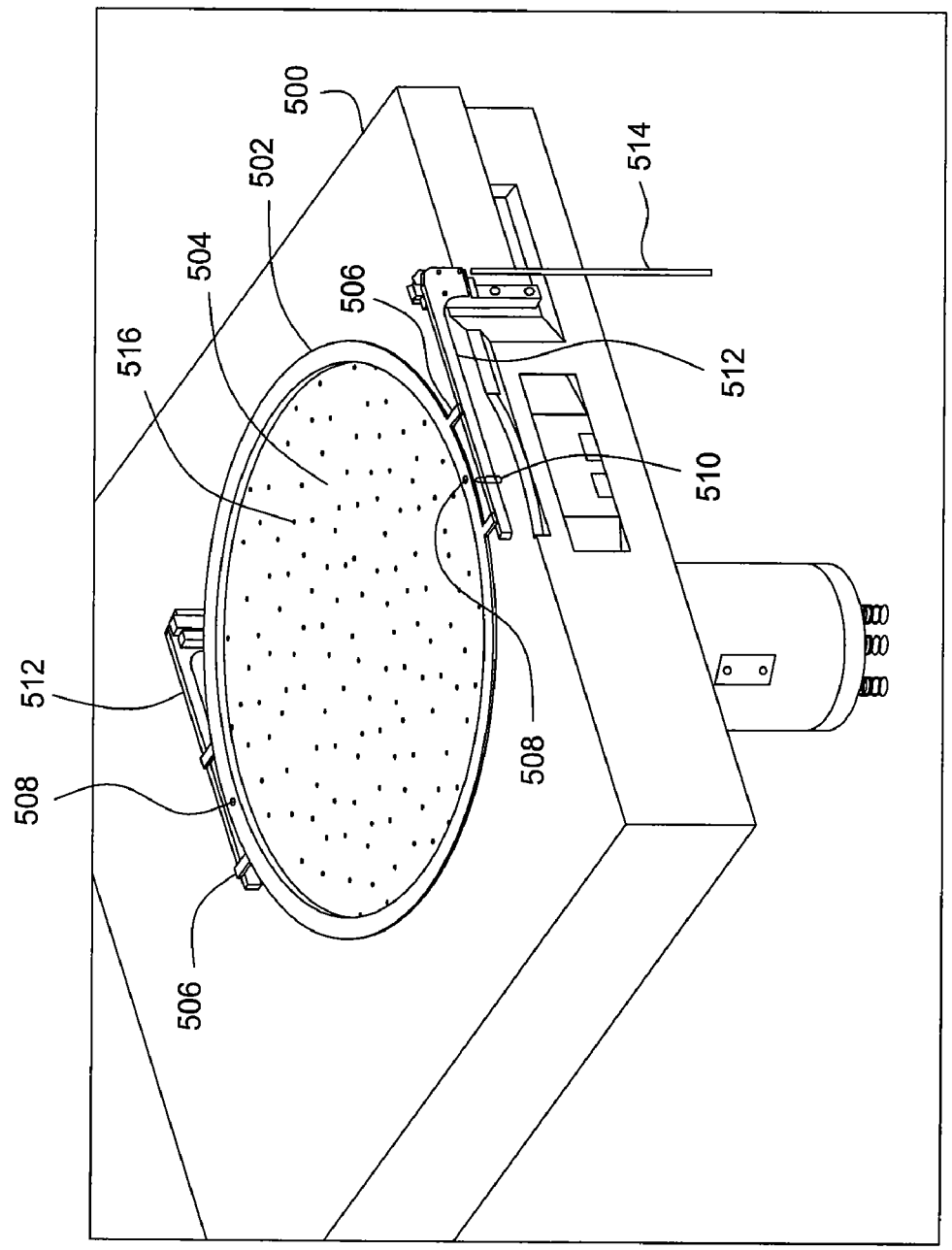
FIG. 5 is a perspective view of an apparatus according to another embodiment of the invention.

FIG. 5 illustrates an alternative embodiment of the invention. A lower portion 500 of a processing chamber is visible. An energy blocker 502 is shown disposed above a substrate support surface 504. Substrate support surface 504 features holes 516 for delivering processing media to portions of a substrate disposed on support surface 504. Energy blocker 502 features a plurality of tabs 506 extending from an outer edge of energy blocker 502. In this embodiment, energy blocker 502 is a ring, annular in shape and formed as a single article, configured to block electromagnetic energy from reaching at least a portion of a substrate disposed on support surface 504. Energy block 502 may be a shadow ring or an edge ring. Energy blocker 502 also features a plurality of alignment points 508, configured as holes in energy blocker 502 for mating with pins 510 disposed on chamber lower portion 500. In this embodiment, energy blocker 502 is manipulated by lift arms 512, which extend beneath the plurality of tabs 506. Lift arms 512 are actuated by lift pins 514, which move lift arms 512 in a vertical direction, enabling lift arms 512 to contact tabs 506 and lift energy blocker 502 thereby. In this embodiment, energy blocker 502 may comprise any material capable of blocking the desired energy and withstanding process conditions. Some preferable materials are discussed above. Energy blocker 502 may be opaque or may transmit some or all electromagnetic energy incident thereon.

Other embodiments of the invention are contemplated, although not illustrated in figures. An annular energy blocker such as those described above may be formed from two or more detachable parts, which may be coupled and uncoupled at convenient times during processing cycles. For example, two or more ring parts may be coupled to form a radiation blocker for a process chamber. During processing, the ring parts may rest on a substrate support to block electromagnetic energy from reaching at least a portion of a substrate disposed on the support. When a substrate is inserted or withdrawn from the process chamber, the ring parts may retract vertically or laterally to allow access to the substrate. For example, three ring parts may each be coupled to a retractor designed to move each ring part a set distance laterally to allow clearance for a substrate to be lifted above the substrate support.

Figure 6:
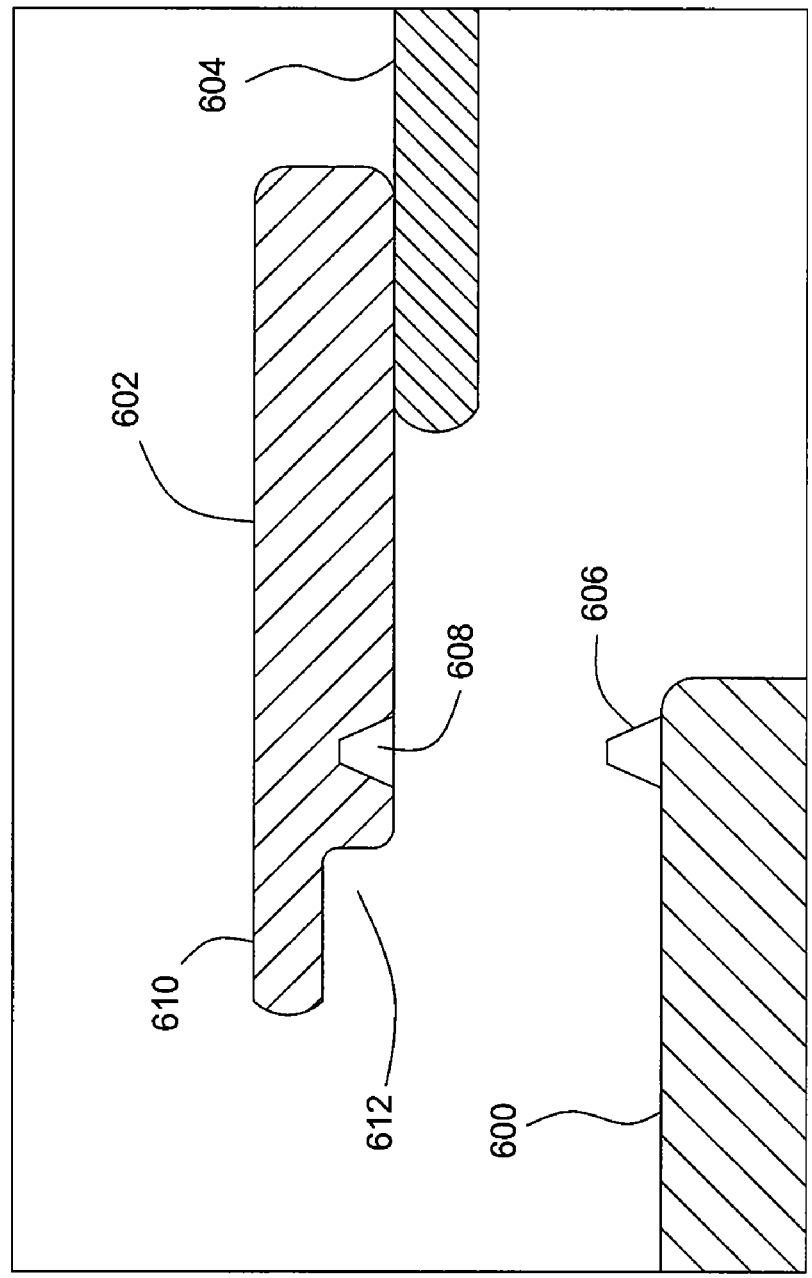
FIG. 6 is a cross-section view of an apparatus according to another embodiment of the invention.

FIG. 6 illustrates another embodiment of the invention. A substrate support 600 is visible, with an energy blocker 602. A support ring 604 is provided in this embodiment for restraining energy blocker 602 when it is not in contact with substrate support 600. When the two are in contact, energy blocker 602 rests on substrate support 600. Alignment is achieved by virtue of pins 606 on substrate support 600, which are configured to mate with recesses 608 in energy blocker 602. In this embodiment, pins 606 are shown as frustroconical extensions protruding from substrate support 600, and configured to insert into recesses 608 with similar shape. In alternate embodiments, however, pins 606 and recesses 608 may have any convenient shape, such as rounded, square, triangular, and the like.

In operation, the apparatus of FIG. 6 functions to passively dispose energy blocker 602 on substrate support 600 during processing. Substrate support 600 will generally be movable in this embodiment, raising and lowering inside the process chamber to facilitate insertion and withdrawal of substrates. When a substrate is disposed on substrate support 600, it raises into a processing position. As substrate support 600 rises, pins 606 contact and mate with recesses 608, lifting energy block 602 from support ring 604. Extension 610 of energy blocker 602 extends above a portion of the substrate disposed on support 600 by virtue of cutaway portion 612, and blocks a portion of electromagnetic energy being directed toward the substrate. In some embodiments, energy blocker 602 may be a shadow ring or an edge ring. After processing, substrate support 600 lowers into a substrate transfer position. Energy blocker 602 rests on support ring 604 and disengages from support 600, creating space for withdrawal of the substrate.

Energy blockers as described herein may also be useful as a method of shielding measurement devices from unwanted radiation inside a process chamber. Devices are commonly deployed inside a process chamber to measure various parameters during processing. In many cases, these devices are sensitive to electromagnetic radiation, and may suffer inaccuracy or damage from energy directly incident from the energy source. An energy blocker as described herein may be used to prevent energy from the source directly impinging measurement devices. For example, in some embodiments, temperature measurement devices, such as pyrometers, may be disposed inside a processing chamber for measuring the temperature of a substrate by sensing electromagnetic energy radiated by the substrate. Such instruments would be inaccurate if energy directly from the source were to impinge on them. A radiation blocker such as that described herein may block at least a portion of electromagnetic energy that might otherwise impinge directly on the device.

While the foregoing is directed to embodiments of the present invention, other and further embodiments of the invention may be devised without departing from the basic scope thereof, and the scope thereof is determined by the claims that follow.

We claim:

1. A method of thermally processing a substrate in a processing chamber, comprising:
   positioning the substrate on a substrate support in the processing chamber;
   directing electromagnetic energy toward the substrate; and
   positioning an energy blocker to block at least a portion of the electromagnetic energy from striking an edge of the substrate while exposing the center of the substrate to the electromagnetic energy, wherein the positioning an energy blocker comprises using alignment points to align the energy blocker with the substrate support.

2. The method of claim 1, wherein the energy blocker rests on the substrate support.

3. The method of claim 2, wherein a portion of the energy blocker is positioned less than about 2 millimeters from the substrate.

4. The method of claim 1, wherein the energy blocker creates a shadow on the substrate up to about 3 millimeters from the edge of the substrate.

5. A method of thermally processing a substrate in a processing chamber, comprising:
   positioning the substrate on a substrate support in the processing chamber;
   directing electromagnetic energy toward the substrate;
   engaging an energy blocker and the substrate support, the energy blocker configured to block at least a portion of the electromagnetic energy from striking an edge of the substrate while exposing the center of the substrate to the electromagnetic energy;
   exposing the center of the substrate to electromagnetic radiation; then disengaging the energy blocker and the substrate support; and then removing the substrate from the processing chamber.

6. The method of claim 5, wherein the disengaging the energy blocker and the substrate support comprises actuating a first set of lift pins disposed below the energy blocker, and wherein the removing the substrate comprises:

actuating a second set of lift pins; and retracting the substrate from the processing chamber with a handling mechanism.

7. The method of claim 6, wherein the first set of lift pins and the second set of left pins are actuated with a single actuator.

8. A method of thermally processing a substrate in a processing chamber, comprising:

positioning the substrate on a substrate support in the processing chamber;

directing electromagnetic energy toward the substrate;

engaging an energy blocker and the substrate support, the energy blocker configured to block at least a portion of the electromagnetic energy from striking an edge of the substrate while exposing the center of the substrate to the electromagnetic energy, wherein the energy blocker comprises alumina, aluminum nitride, quartz, or silicon carbide.

9. A method of thermally processing a substrate in a processing chamber, comprising:

positioning the substrate on a substrate support in the processing chamber;

directing electromagnetic energy toward the substrate;

engaging an energy blocker and the substrate support, the energy blocker configured to block at least a portion of the electromagnetic energy from striking an edge of the substrate while exposing the center of the substrate to the electromagnetic energy, wherein the engaging an energy blocker and the substrate support further comprises inserting a pin coupled to the substrate support into a recess within the energy blocker to align the energy blocker with the substrate support.

* * * * *